(12) United States Patent
Sugiura et al.

(10) Patent No.: US 9,691,713 B2
(45) Date of Patent: Jun. 27, 2017

(54) SEMICONDUCTOR DEVICE

(71) Applicants: DENSO CORPORATION, Kariya, Aichi-pref. (JP); FUJI ELECTRIC CO., LTD., Kawasaki-shi, Kanagawa-pref. (JP)

(72) Inventors: Shun Sugiura, Kariya (JP); Yasushi Ookura, Kariya (JP); Takeshi Fujii, Matsumoto (JP); Tetsutaro Imagawa, Matsumoto (JP)

(73) Assignee: DENSO CORPORATION, Kariya (JP)

( * ) Notice: Subject to any disclaimer, the term of this patent is extended or adjusted under 35 U.S.C. 154(b) by 136 days.

(21) Appl. No.: 14/888,098

(22) PCT Filed: May 29, 2014

(86) PCT No.: PCT/JP2014/002848
§ 371 (c)(1),
(2) Date: Oct. 30, 2015

(87) PCT Pub. No.: WO2014/199582
PCT Pub. Date: Dec. 18, 2014

(65) Prior Publication Data
US 2016/0163656 A1    Jun. 9, 2016

(30) Foreign Application Priority Data

Jun. 11, 2013   (JP) .................................. 2013-122918

(51) Int. Cl.
*H01L 23/58* (2006.01)
*H01L 23/00* (2006.01)
(Continued)

(52) U.S. Cl.
CPC ............ *H01L 23/562* (2013.01); *H01L 23/34* (2013.01); *H01L 23/4824* (2013.01);
(Continued)

(58) Field of Classification Search
CPC ..... H01L 29/772; H01L 23/498; H01L 23/00; H01L 23/528
(Continued)

(56) References Cited

U.S. PATENT DOCUMENTS 5,831,291 A  *  11/1998  Evans ................. H01L 23/3185
                                                        257/137
6,803,667 B2 *  10/2004  Okura ................... H01L 23/293
                                                        257/666
(Continued)

FOREIGN PATENT DOCUMENTS

JP   2003-224275 A   8/2003
JP   2005-019830 A   1/2005
(Continued)

OTHER PUBLICATIONS

International Search Report of the International Searching Authority mailed Jul. 15, 2014 for the corresponding international application No. PCT/JP2014/002848 (and English translation).
(Continued)

*Primary Examiner* — Caleb Henry
(74) *Attorney, Agent, or Firm* — Posz Law Group, PLC

(57)   ABSTRACT

A semiconductor device includes: a semiconductor substrate having an element; a front surface electrode connected to the element; a rear surface electrode connected to the element; a protective film disposed on the front surface of the semiconductor substrate in a separation region; and a temperature sensor disposed on a front surface side of the semiconductor substrate. The front surface electrode is divided into multiple pieces along at least two directions with the protective film. The separation region includes an opposing region located between opposing sides of divided pieces of the front surface electrode adjacent to each other, and an intersection region, at which the opposing region
(Continued)

intersects. The temperature sensor is disposed in only the opposing region.

7 Claims, 6 Drawing Sheets

(51) Int. Cl.
    *H01L 23/34*     (2006.01)
    *H01L 29/417*     (2006.01)
    *H01L 23/482*     (2006.01)
    *H01L 27/02*     (2006.01)
    *H01L 23/528*     (2006.01)

(52) U.S. Cl.
    CPC ........ *H01L 23/528* (2013.01); *H01L 27/0255* (2013.01); *H01L 29/417* (2013.01); *H01L 2924/0002* (2013.01)

(58) Field of Classification Search
    USPC .................................. 257/48, 330, 737, 782
    See application file for complete search history.

(56) References Cited

U.S. PATENT DOCUMENTS

| | | | |
|---|---|---|---|
| 7,009,292 B2* | 3/2006 | Miura | H01L 23/4334 257/178 |
| 8,426,864 B2* | 4/2013 | Tsuji | G01J 5/02 257/184 |
| 8,441,122 B2* | 5/2013 | Fukuoka | H01L 23/3192 257/717 |
| 9,314,930 B2* | 4/2016 | Golda | B25J 15/0085 |
| 2005/0121701 A1* | 6/2005 | Hirano | G01K 7/01 257/287 |
| 2005/0280078 A1 | 12/2005 | Teramae et al. | |
| 2006/0055056 A1 | 3/2006 | Miura et al. | |
| 2006/0220180 A1 | 10/2006 | Takahashi | |
| 2007/0001265 A1* | 1/2007 | Narazaki | H01L 23/482 257/587 |
| 2009/0085031 A1* | 4/2009 | Matsuda | G01K 1/16 257/48 |
| 2009/0159116 A1* | 6/2009 | Umetani | H01L 31/0508 136/251 |
| 2010/0071761 A1* | 3/2010 | Kobamoto | H01L 31/02242 136/256 |
| 2011/0042741 A1 | 2/2011 | Fukuoka et al. | |
| 2011/0256668 A1* | 10/2011 | Urano | H01L 21/6836 438/114 |

FOREIGN PATENT DOCUMENTS

| | | |
|---|---|---|
| JP | 2012-099695 A | 5/2012 |
| JP | 2012-156398 A | 8/2012 |
| JP | 2012-195338 A | 10/2012 |

OTHER PUBLICATIONS

Written Opinion of the International Searching Authority mailed Jul. 15, 2014 for the corresponding international application No. PCT/JP2014/002848 (and English translation).

* cited by examiner

SEMICONDUCTOR DEVICE

CROSS REFERENCE TO RELATED APPLICATIONS

This application is a U.S. national stage of International Application No. PCT/JP2014/002848 filed on May 29, 2014 and is based on Japanese Patent Application No. 2013-122918 filed on Jun. 11, 2013, the disclosure of which is incorporated herein by reference.

TECHNICAL FIELD

The present disclosure relates to a semiconductor device including a front surface electrode formed on a front surface of a semiconductor substrate, a rear surface electrode formed on a rear surface opposite to the front surface, and a temperature sensor formed on a front surface side of the semiconductor substrate, in which the front surface electrode and the rear surface electrode are soldered to each other.

BACKGROUND ART

Up to now, as disclosed in Patent Literature 1, a semiconductor device including a front surface electrode (emitter electrode, Au plating film) formed on a front surface of a semiconductor substrate, a rear surface electrode formed on a rear surface opposite to the front surface, and a temperature sensor formed on a front surface side of the semiconductor substrate in which both of the front surface electrode and the rear surface electrode are soldered.

According to the semiconductor device, a heat can be radiated from both surface sides of the semiconductor substrate.

Incidentally, in the semiconductor device in which not only the rear surface electrode but also the front surface electrode is soldered, such a problem that the semiconductor device is warped due to a linear expansion coefficient difference between the semiconductor substrate and the electrodes occurs. In the semiconductor device disclosed in Patent Literature 1, the front surface electrode is divided in one direction along the front surface of the semiconductor substrate. Therefore, the warp can be suppressed in the one direction, but the warp occurs in a direction orthogonal to the one direction.

On the contrary, it is also proposed that the front surface electrode is divided in at least two directions along the front surface. However, when the front surface electrode is divided independently of the arrangement of the temperature sensor, a temperature at a place where the temperature sensor is disposed is excessively high, and such a problem that a temperature detection precision of the element decreases occurs.

PRIOR ART LITERATURES

Patent Literature

Patent Literature 1: JP-2005-268496 A

SUMMARY OF INVENTION

It is an object of the present disclosure to provide a semiconductor device, in which both of a front surface electrode and a rear surface electrode are soldered, suppressing a reduction in a temperature detection precision of a temperature sensor while suppressing warp.

According to a first aspect of the present disclosure, a semiconductor device includes: a semiconductor substrate having an element; a front surface electrode that is electrically connected to the element and disposed on a front surface of the semiconductor substrate; a rear surface electrode that is electrically connected to the element and disposed on a rear surface of the semiconductor substrate opposite to the front surface; a protective film that is disposed on the front surface of the semiconductor substrate in a separation region; and a temperature sensor that is disposed on a front surface side of the semiconductor substrate. The front surface electrode is divided into a plurality of pieces along at least two directions on the front surface with the protective film in the separation region. The separation region includes an opposing region located between opposing sides of divided pieces of the front surface electrode, which are adjacent to each other, and an intersection region, at which the opposing region intersects. The temperature sensor is disposed in only the opposing region.

In the semiconductor device, because the front surface electrode is divided in not only one direction along the front surface of the semiconductor substrate but also at least two directions, the warp of the semiconductor device can be effectively suppressed. Because the temperature sensor is disposed in only the opposite region, the protective film around the temperature sensor is small as compared with a configuration disposed in the intersecting region. Therefore, a heat resistance increase caused by a centralized placement of the protective film around the temperature sensor is suppressed, and the temperature can be suppressed from being excessively high around the temperature sensor. With the above configuration, the detected temperature by the temperature sensor can be restrained from becoming excessively high relative to the temperature of the element, that is, a temperature detection precision can be restrained from being lowered.

BRIEF DESCRIPTION OF DRAWINGS

The above and other objects, features and advantages of the present disclosure will become more apparent from the following detailed description made with reference to the accompanying drawings. In the drawings.

EMBODIMENTS FOR CARRYING OUT INVENTION

Figure 1:
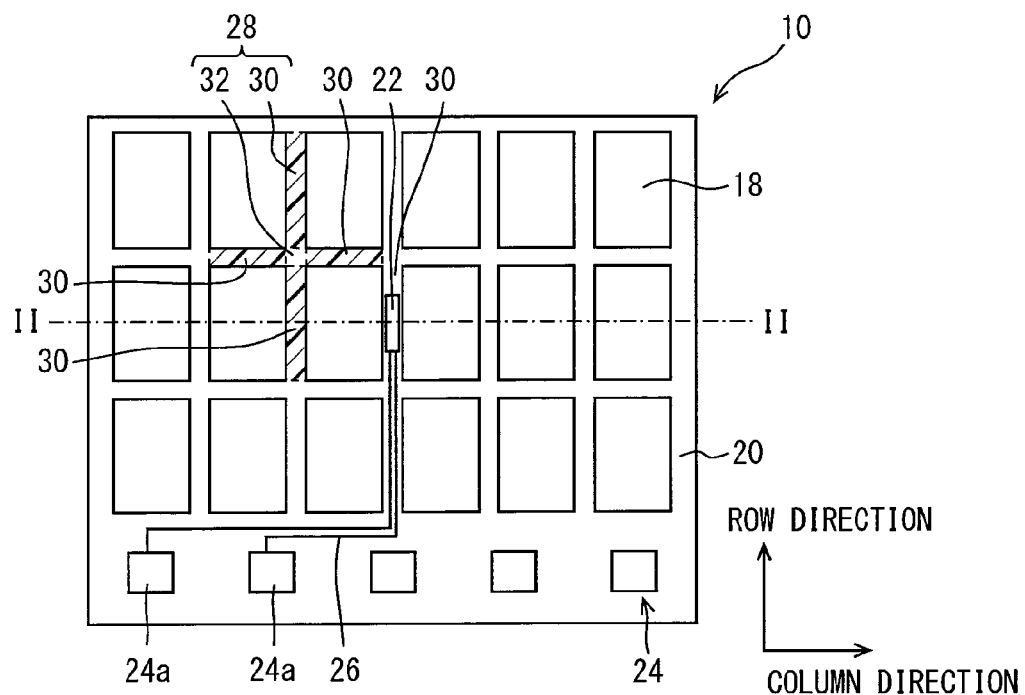
FIG. 1 is a top view illustrating a schematic configuration of a semiconductor device according to a first embodiment.

Hereinafter, embodiments of the present disclosure will be described with reference to the drawings. In the respective embodiments described below, the common or associated elements are given the same reference numerals. In the following description, among directions along a front surface of a semiconductor substrate, one of a lateral direction and a longitudinal direction of a plane rectangle is indicated as a row direction, and the remaining direction is indicated as a column direction. A thickness direction of the semiconductor substrate is merely indicated as a thickness direction. In top views illustrated in FIGS. 1, 3, 4, and 13 to 16, in order to facilitate understanding of a positional relationship between an opposite region and an intersection region as a separation region, a part of the opposite region is hatched.

(First Embodiment)

First, a schematic configuration of a semiconductor device will be described. In this embodiment, a lateral direction is indicated by a row direction, and a longitudinal direction is indicated by a column direction.

Figure 2:
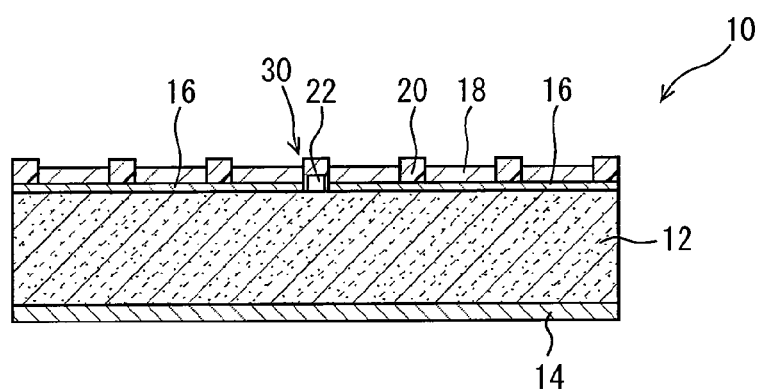
FIG. 2 is a cross-sectional view taken along a line II-II of FIG. 1.
Figure 3:
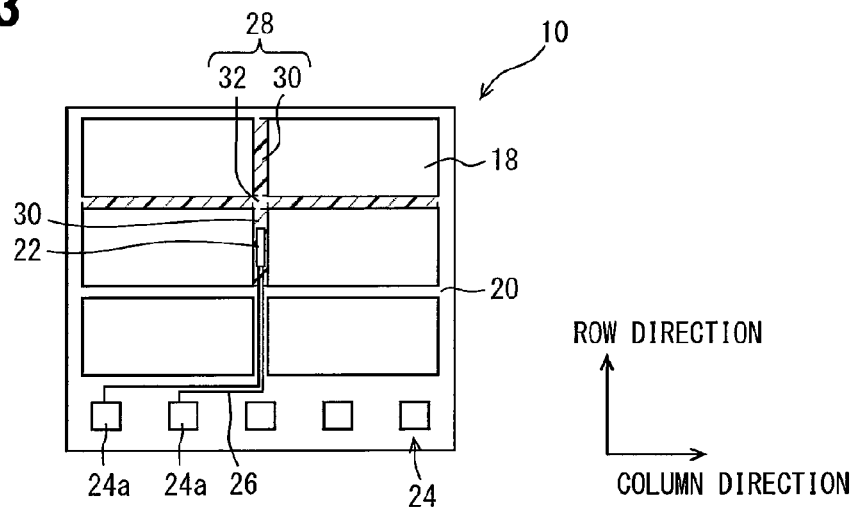
FIG. 3 is a top view illustrating a first modification.

A semiconductor device 10 illustrated in FIGS. 1 and 2 includes a semiconductor substrate 12 on which an element is formed. In this embodiment, an IGBT is formed on the semiconductor substrate 12 made of a monocrystal silicon. A rear surface electrode 14 is formed as a collector electrode on an overall region of a rear surface in a front surface and the rear surface of the semiconductor substrate 12. The rear surface electrode 14 is electrically connected to a collector region of the IGBT. The rear surface electrode 14 is soldered to a metal member not shown.

On the other hand, a base electrode 16 is formed on the front surface of the semiconductor substrate 12. The base electrode 16 is made of a material mainly including aluminum, and electrically connected to an emitter region of the IGBT. In order to improve wettability for soldering, a front surface electrode 18 is formed on the base electrode 16. The front surface electrode 18 is made of, for example, nickel plating, and the front surface electrode 18 and the base electrode 16 configure an emitter electrode. The front surface electrode 18 is also soldered to a metal member not shown.

A protective film 20 is formed on the front surface of the semiconductor substrate 12. The protective film 20 is made of, for example, polyimide, and disposed in a separation region 28 on the front surface of the semiconductor substrate 12. The front surface electrode 18 is divided into multiple pieces in at least two directions along the front surface of the semiconductor substrate 12 with the protective film 20 in the separation region 28. In other words, the separation region 28 in which the front surface electrode 18 is divided into multiple pieces with the protective film 20. In this embodiment, the front surface electrode 18 is divided into multiple pieces in each of the row direction and the column direction.

A temperature sensor 22 is formed on a front surface side of the semiconductor substrate 12, electrically independently from the base electrode 16 and the front surface electrode 18. In order to protect the element from overheating, the temperature sensor 22 detects a temperature of the semiconductor substrate 12. In this embodiment, the temperature sensor 22 is formed of a diode which is made of polysilicon doped with impurity, and a forward voltage Vf is changed according to a temperature. A detection signal of the temperature sensor 22 is used for controlling on/off operation of a gate of the IGBT, and in detail, the IGBT is forcedly turned off before the IGBT is put into an overheating state.

The temperature sensor 22 is formed on the front surface of the semiconductor substrate 12 through an insulating film not shown. The temperature sensor 22 is coated with the protective film 20.

Reference numeral 24 illustrated in FIG. 1 is a control terminal of the semiconductor device 10. In this embodiment, the five control terminals 24 are provided, and those control terminals 24 are aligned in the column direction on one end side of the semiconductor substrate 12 in the row direction. Temperature sensor terminals 24a among the control terminals 24 are electrically connected to the temperature sensor 22 through respective wires 26. The other control units 24 include a gate electrode control terminal, a current sense control terminal, and an emitter sense control terminal. For example, a gate line that connects the gate electrode control terminal to the gate electrode is also covered with the protective film 20.

Subsequently, a division structure of the front surface electrode 18 and an arrangement of the temperature sensor 22 will be described in detail.

As described above, the front surface electrode 18 is divided into multiple pieces in each of the row direction and the column direction with the protective film 20 in the separation region 28. A shape of the front surface electrodes 18 is equal to each other in a substantially plane rectangle, and the respective front surface electrodes 18 are arranged at regular intervals in a matrix of 3×6. In other words, the respective front surface electrodes 18 are divided in a matrix of 3×6 with the protective film 20 with regularity. That is, the front surface electrodes 18 divided into the multiple pieces are symmetrical with respect to a line in each of the row direction and the column direction.

The separation region 28 includes an opposite region 30 located between opposite sides of the front surface electrode 18 divided and adjacent to each other, and an intersection region 32 in which the separation regions 28 intersect with each other. In this embodiment, the opposite region 30 is defined between the opposite sides of the adjacent front surface electrodes 18 in each of the row direction and the column direction. A portion in which the separation region 28 where the front surface electrode 18 is divided in the row direction intersects with the separation region 28 that divides the front surface electrode 18 in the column direction is defined as the intersection region 32. In other words, as illustrated in FIG. 1, a cross intersection portion is defined as the intersection region 32. The intersection region 32 is formed into a substantially rectangle in plane.

The temperature sensor 22 is formed at substantially a center position of the region in which the front surface electrode 18 is formed. The temperature sensor 22 is disposed in only the opposite region 30 of the separation region 28. In other words, the overall temperature sensor 22 is disposed within the opposite region 30. In detail, the temperature sensor 22 is disposed in the opposite region 30 corresponding to a second row in the row direction and located between a third column and a fourth column in the column direction.

Subsequently, advantages of the semiconductor device 10 according to this embodiment will be described.

Incidentally, in the configuration where the emitter electrode is soldered, the front surface electrode needs to be provided on the base electrode. This causes such a problem that the emitter electrode becomes thicker, and the semiconductor device is warped due to a linear expansion coefficient difference between the semiconductor substrate and the electrode (rear surface electrode, base electrode, front surface electrode). On the contrary, according to this embodiment, the front surface electrode 18 is divided into only one direction along the front surface of the semiconductor substrate 12 but also at least two directions. Therefore, the warp of the semiconductor device 10 can be effectively suppressed in a plane orthogonal to the thickness direction.

In particular, in this embodiment, the front surface electrode 18 is divided into multiple pieces in the row direction and the column direction which are orthogonal to each other. Therefore, the warp of the semiconductor device 10 can be more effectively suppressed in the plane orthogonal to the thickness direction.

The temperature sensor 22 is disposed in only the opposite region 30. As compared with a configuration in which the temperature sensor 22 is disposed in the intersection region 32, the protective film 20 around the temperature sensor 22 is small. Therefore, a heat resistance increase caused by a centralized placement of the protective film 20 around the temperature sensor 22 is suppressed, and the temperature can be suppressed from being excessively high around the temperature sensor 22. With the above configuration, the detected temperature by the temperature sensor 22 can be restrained from becoming excessively high relative to the temperature of the element, that is, a temperature detection precision can be restrained from being lowered.

In this embodiment, the front surface electrodes 18 divided into the multiple pieces are symmetrical with respect to a center line in the row direction, and symmetrical with respect to a center line in the column direction. Therefore, even if the semiconductor device 10 is warped, a deviation of the warp can be suppressed.

The temperature sensor 22 is disposed in the center of the region in which the front surface electrode 18 is formed. A temperature of the element is highest in the center of the front surface electrode 18. The temperature sensor 22 detects the temperature of the element, and the element can be appropriately protected.

In particular, in this embodiment, the front surface electrode 18 is divided into an odd number of pieces in the row direction and an even number of pieces in the column direction, and the temperature sensor 22 is disposed in the opposite region 30 corresponding to a middle of the odd number of pieces in the row direction. According to the above configuration, the division of the front surface electrode 18 in the multiple directions different from each other, and the arrangement of the temperature sensor 22 in the center of the front surface electrode 18 can be realized with a simple structure.

(Modifications)

When the temperature sensor 22 is disposed in the vicinity of the center of the front surface electrode 18, the front surface electrode 18 may be divided in the odd number of pieces in the row direction and the even number of pieces in the column direction, and the number of divisions is not limited to the above example. For example, as in a first modification illustrated in FIG. 3, the front surface electrode 18 may be divided in a matrix of 3×2, and the temperature sensor 22 may be disposed within the opposite region 30 corresponding to a second row in the row, and located between a first column and a second column in the column direction.

Figure 4:
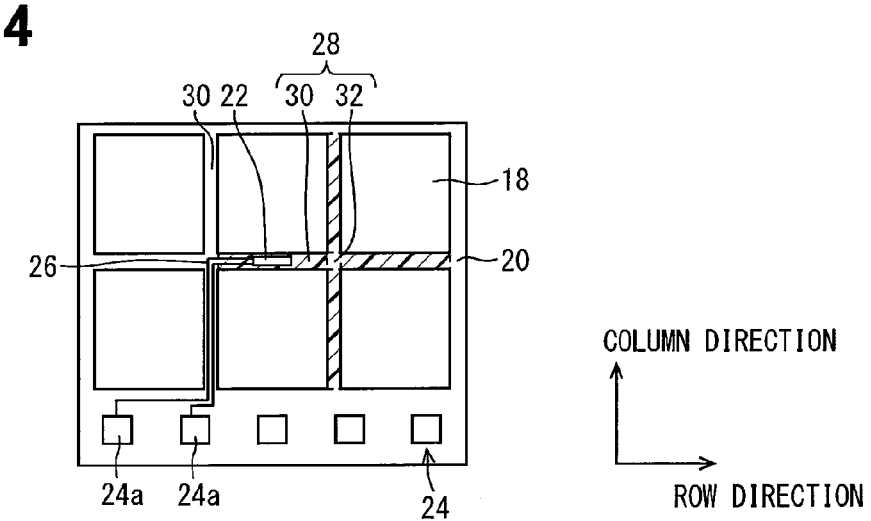
FIG. 4 is a top view illustrating a second modification.

As in a second modification illustrated in FIG. 4, the front surface electrode 18 is divided into a matrix of 3×2 with a lateral direction of a plane rectangle as the column direction and a longitudinal direction as the row direction. The temperature sensor 22 may be disposed within the opposite region 30 corresponding to a second row in the row direction, and located between a first column and a second column in the column direction.

The division patterns shown in the first modification and the second modification are patterns in which the number of divisions of the front surface electrode 18 is minimum (6 pieces) in the configuration where the temperature sensor 22 is disposed in the vicinity of the center of the front surface electrode 18. Therefore, the semiconductor device 10 can be more simplified. Similarly, in the examples illustrated in FIGS. 3 and 4, the cross intersection portion defines the intersection region 32.

(Test Results)

Figure 11:
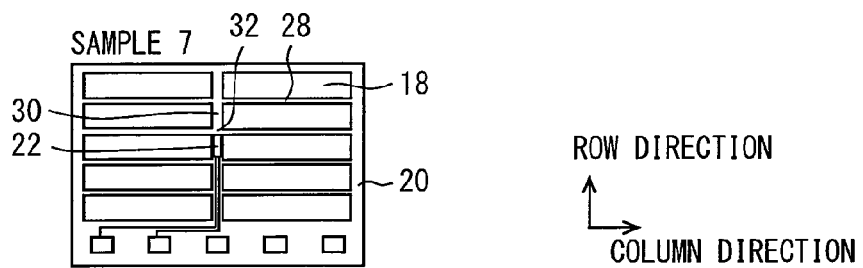
FIG. 11 is a top view illustrating a schematic configuration of a sample 7 used for a test.
Figure 12:
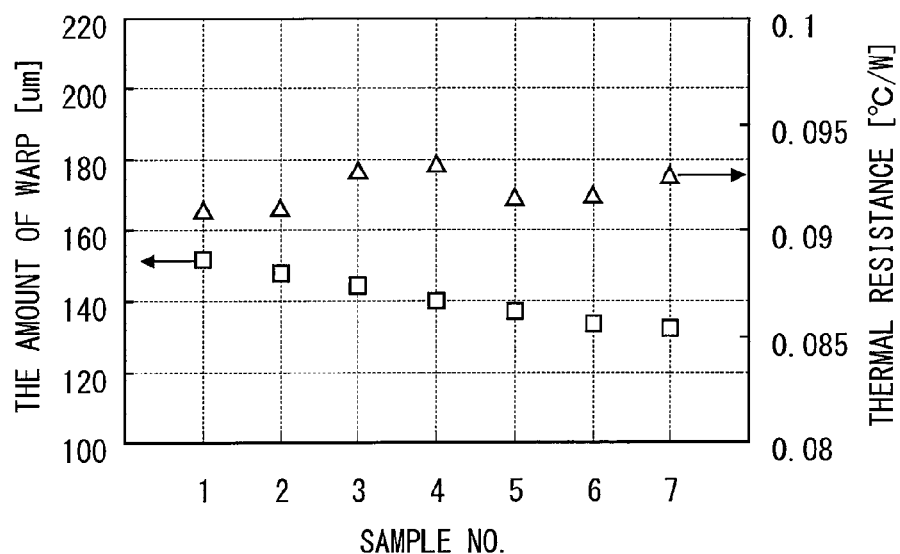
FIG. 12 is a diagram illustrating the amount of warp and a thermal resistance of each sample.

The present inventors have created seven kinds of samples different in the division of the front surface electrode 18. FIGS. 5 to 11 illustrate schematic configurations of the respective samples. In each of the samples, the amount of warp and the thermal resistance are measured. The measurement results are illustrated in FIG. 12.

In each of the samples, the semiconductor substrate 12 is about 10.6 mm in the row direction and about 12.6 mm in the column direction. The region in which the front surface electrode 18 is formed is the same, and set to about 8 mm in the row direction and about 11 mm in the column direction. The temperature sensor 22 is located in the center of a formation region of the front surface electrode 18. A width of the separation region 28 is set to about 0.4 mm, and a length of the temperature sensor 22 in the row direction is set to about 0.8 mm.

Figure 5:
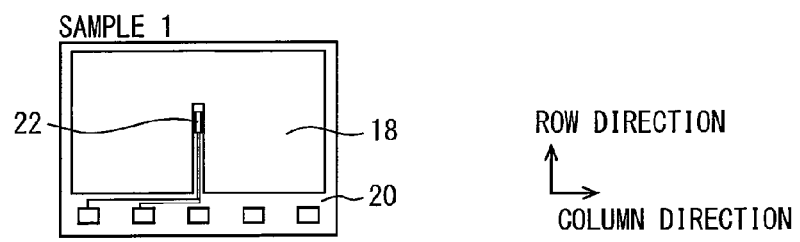
FIG. 5 is a top view illustrating a schematic configuration of a sample 1 used for a test.
Figure 6:
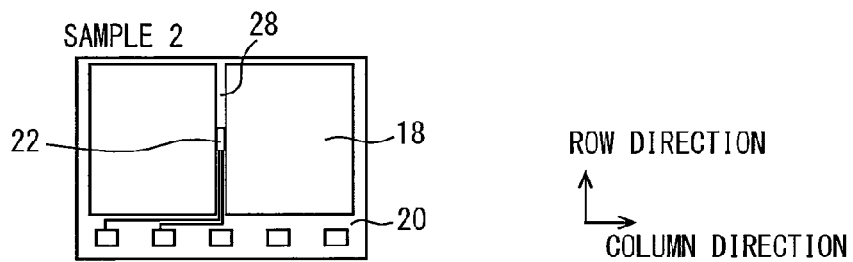
FIG. 6 is a top view illustrating a schematic configuration of a sample 2 used for a test.
Figure 7:
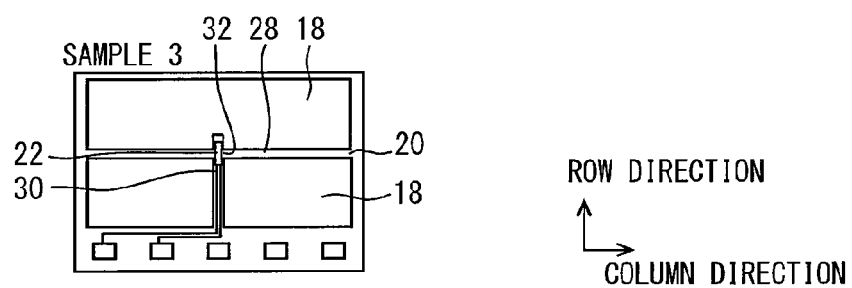
FIG. 7 is a top view illustrating a schematic configuration of a sample 3 used for a test.

As illustrated in FIG. 5, in a sample 1, the front surface electrode 18 is not divided. In other words, the number of front surface electrodes 18 is "1". As illustrated in FIG. 6, in a sample 2, the front surface electrode 18 is divided into two pieces in the column direction. In other words, the number of front surface electrodes 18 is "2". As illustrated in FIG. 7, in a sample 3, the front surface electrode 18 is divided into two pieces in the row direction, and only one row is divided into two pieces in the column direction. In other words, the number of front surface electrodes 18 is "3". Since the length of the temperature sensor 22 is longer than the width of the separation region 28, the separation region 28 extends up to a part (about 0.3 mm) of the front surface electrode 18 on an upper side of a paper surface. Most of the temperature sensor 22 is disposed in the intersection region 32 while the remaining part of the temperature sensor 22 is disposed in the opposite region 30 and the extension region.

Figure 8:
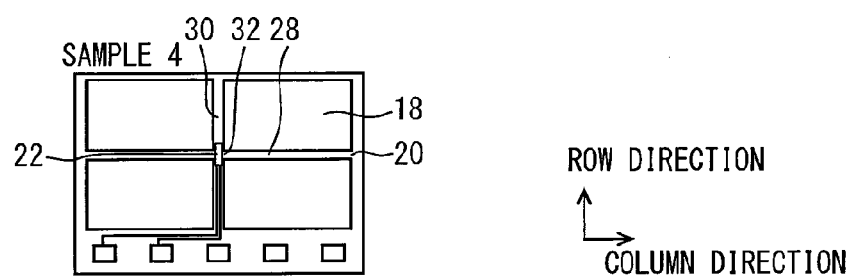
FIG. 8 is a top view illustrating a schematic configuration of a sample 4 used for a test.
Figure 9:
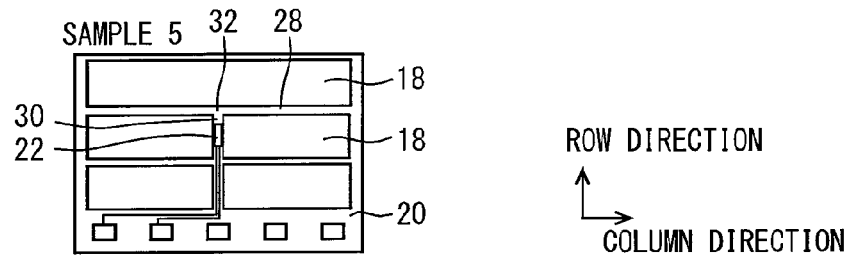
FIG. 9 is a top view illustrating a schematic configuration of a sample 5 used for a test.

As illustrated in FIG. 8, in a sample 4, the front surface electrode 18 is divided into two pieces in the row direction, and divided into two pieces in the column direction. In other words, the number of front surface electrodes 18 is "4". Most of the temperature sensor 22 is disposed in the intersection region 32 while the remaining part is disposed in the opposite region 30. As illustrated in FIG. 9, in a sample 5, the front surface electrode 18 is divided into three pieces in the row direction, and only two rows on a lower side of the paper surface are divided into two pieces in the column direction. In other words, the number of front surface electrodes 18 is "5". The overall temperature sensor 22 is disposed in the opposite region 30.

Figure 10:
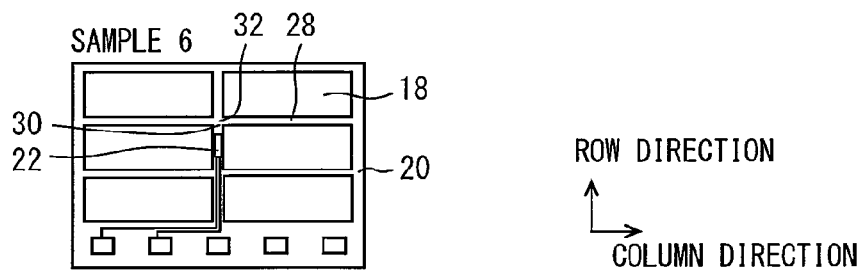
FIG. 10 is a top view illustrating a schematic configuration of a sample 6 used for a test.

As illustrated in FIG. 10, in a sample 6, the front surface electrode 18 is divided into three pieces in the row direction, and divided into two pieces in the column direction. In other words, the number of front surface electrodes 18 is "6", and the front surface electrodes 18 have the same configuration as that in the first modification. The overall temperature sensor 22 is disposed in the opposite region 30. As illustrated in FIG. 11, in a sample 7, the front surface electrode 18 is divided into five pieces in the row direction, and divided into two pieces in the column direction. In other words, the number of front surface electrodes 18 is "10". The overall temperature sensor 22 is disposed in the opposite region 30.

As illustrated in FIG. 12, it becomes apparent from the results of the samples 2 and 4 that when the front surface electrode 18 is divided into two pieces, the warp can be reduced. It becomes apparent from the results of the samples 1 to 7 that the warp can be reduced more as the number of divisions of the front surface electrode 18 is larger. It becomes apparent from the results of the samples 1 to 4 that when the temperature sensor 22 is disposed in the intersection region 32, the thermal resistance becomes higher. Further, in the samples 5 to 7 in which the temperature sensor 22 is disposed in the opposite region 30, the warp can be reduced, and the thermal resistance can be reduced more than those in the samples 3 and 4. The sample 6 can be reduced in warp more than the sample 5, and shows substantially the same thermal resistance as that in the sample 5.

(Second Embodiment)

In this embodiment, parts common to the semiconductor device 10 described in the above embodiment will be omitted from the description.

Figure 13:
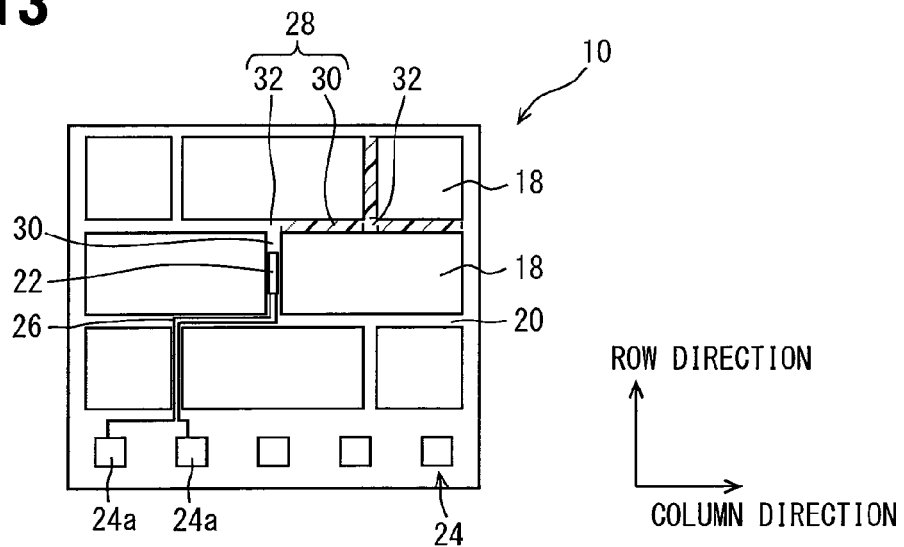
FIG. 13 is a top view illustrating a schematic configuration of a semiconductor device according to a second embodiment.

This embodiment is characterized in that the number of columns in parts of rows is different from the number of columns in the remaining rows in the divided front surface electrodes 18. FIG. 13 illustrates an example of the configuration in which the front surface electrode 18 is divided into an odd number of pieces in the row direction, only a center row of the odd numbers of pieces is divided into an even number of pieces in the column direction, and the remaining rows are each divided into an odd number of pieces in the column direction. In FIG. 13, the front surface electrode 18 is divided into three pieces in the row direction, only a second row is divided into two pieces in the column direction, and a first row and a third row are each divided into three pieces in the column direction.

The shapes of two front surface electrodes 18 on a second row are formed into a substantially rectangle in plane, and equal to each other. In a first row and a third row, the shapes of the front surface electrodes 18 on a first column and a third column are formed into a substantially rectangle in plane, and equal to each other. The front surface electrodes 18 divided into the multiple pieces are symmetrical with respect to a line in each of the row direction and the column direction.

The temperature sensor 22 is disposed at substantially a center position of the region in which the front surface electrode 18 is formed, and in the opposite region 30 between two front surface electrodes 18 on a second row. In FIG. 13, a T-shaped intersection portion defines the intersection region 32. The intersection region 32 is formed into substantially a rectangle in a top view.

Subsequently, advantages of the semiconductor device 10 according to this embodiment will be described.

The semiconductor device 10 according to this embodiment can obtain the same advantages as those in the first embodiment. In the first row and the third row, the front surface electrode 18 is divided into not the same two columns as those as the second row, but three columns larger in the number than the second row. Therefore, as compared with the configuration in which the number of columns is the same in all of the rows, the warp in the column direction can be more effectively suppressed.

(Modifications)

Figure 14:
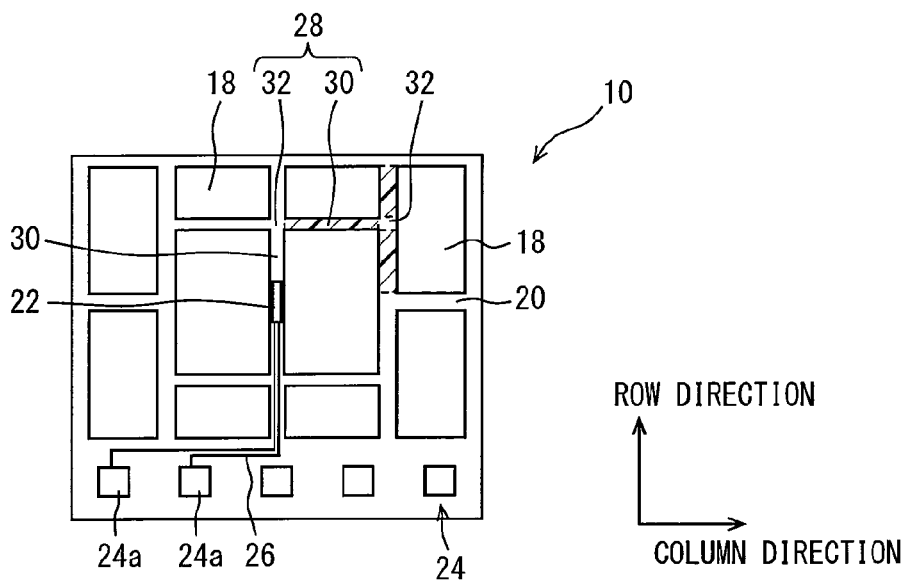
FIG. 14 is a top view illustrating a third modification.

The number of rows in parts of columns of the divided front surface electrodes 18 may be different from the number of rows in the remaining columns. FIG. 14 illustrates an example of the configuration in which the front surface electrode 18 is divided into four or more even numbers of pieces in the column direction, only two center columns are divided into an odd number of pieces in the row direction, and the remaining columns are divided into an even number of pieces in the row direction. In a third modification illustrated in FIG. 14, the front surface electrode 18 is divided into four pieces in the column direction, divided into three pieces in the row direction on a second column and a third column, and divided into two pieces in the row direction on a first column and a fourth column.

The shapes of the respective two front surface electrodes 18 on the first column and the fourth column are formed into a substantially rectangle in plane, and equal to each other. In the second column and the third column, the shapes of the front surface electrodes 18 on a first row and a third row are formed into a substantially rectangle in plane, and equal to each other. The front surface electrodes 18 divided into the multiple pieces are symmetrical with respect to a line in each of the row direction and the column direction.

The temperature sensor 22 is disposed at substantially a center position of the region in which the front surface electrode 18 is formed, and in the opposite region 30 between the front surface electrodes 18 on the second column and the third column. In FIG. 14, a T-shaped intersection portion and the cross intersection portion define the intersection region 32.

When the number of rows on the first column and the fourth column is set to be larger than that on the second column and the third column, the warp in the row direction can be more effectively suppressed than that in the configuration in which the number of rows is set to be the same on all of the columns.

(Third Embodiment)

In this embodiment, parts common to those in the semiconductor device 10 shown in the first embodiment will be omitted from the description.

In this embodiment, a front surface electrode 18 includes two center electrodes 34 adjacent to the opposite region 30 in which a temperature sensor 22 is disposed, and multiple peripheral electrodes 36 disposed to surround the center electrodes 34.

Figure 15:
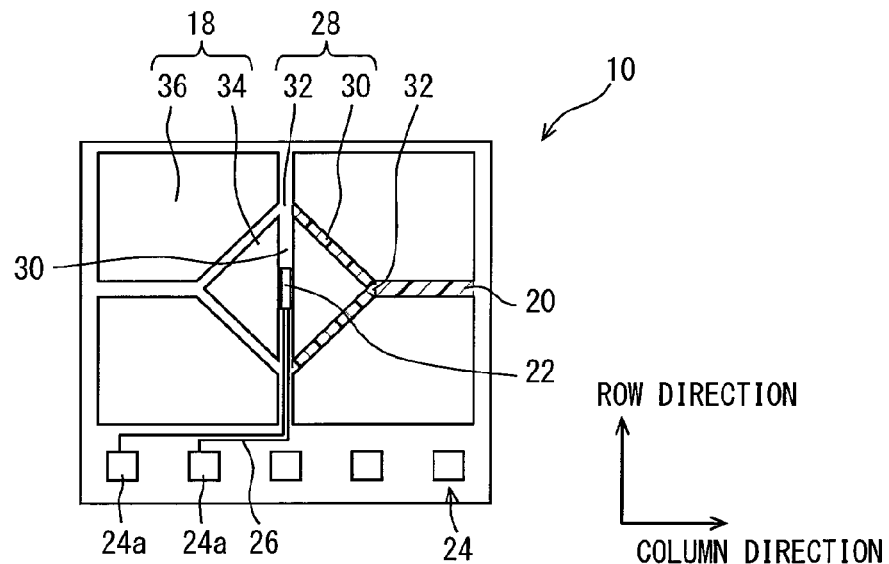
FIG. 15 is a top view illustrating a schematic configuration of a semiconductor device according to a third embodiment.

FIG. 15 illustrates an example of this embodiment. In FIG. 15, two center electrodes 34 are each formed into an isosceles triangle, and a temperature sensor 22 is disposed in the opposite region 30 between the respective bases. The peripheral electrodes 36 are divided into two pieces in the row direction and divided in two pieces in the column direction so as to surround the center electrodes 34. The four peripheral electrodes 36 are formed into a pentagon in which one corner of a rectangle in plane is cut out. The front surface electrode 18 divided into the multiple pieces is symmetrical with respect to a line in each of the row direction and the column direction.

As illustrated in FIG. 15, the peripheral electrodes 36 are each divided into two pieces in the row direction and the column direction. Similarly, the center electrodes 34 are divided into two pieces in the column direction. The separation region 28 in which the center electrodes 34 and the peripheral electrodes 36 are divided is extended with an inclination of about 45 degrees in each of the row direction and the column direction. In FIG. 15, a Y-shaped intersection portion and a modified cross-shaped intersection portion define the intersection region 32. The Y-shaped intersection region 32 is formed into a substantially triangle in plane.

Subsequently, advantages of the semiconductor device 10 according to this embodiment will be described.

The semiconductor device 10 according to this embodiment can obtain the same advantages as those in the first embodiment. In the same number of electrodes, a rate of the separation region 28 in the region in which the front surface electrode 18 is formed can be reduced more than that in the first embodiment. With the above configuration, a reduction in the heat radiation from the front surface electrode 18 toward the metal member can be suppressed while the division structure is applied.

(Modifications)

A configuration having the center electrodes 34 and the peripheral electrodes 36 is not limited to the above example. For example, as in a fourth modification illustrated in FIG. 16, two center electrodes 34 are formed into a rectangle in plane equal to each other, and a temperature sensor 22 is disposed in the opposite region 30 between the two center electrodes 34. The peripheral electrodes 36 are divided into six pieces so as to surround the center electrodes 34. Two peripheral electrodes 36 are located on each of the upper and lower sides of the paper surface with respect to the center electrodes 34. One peripheral electrode 36 is located on each of right and left sides of the paper surface with respect to the center electrodes 34. The opposite regions 30 of portions where the upper and lower peripheral electrodes 36 and the right and left peripheral electrodes 36 are adjacent to each other are extended with an inclination in each of the row direction and the column direction. For that reason, the upper and lower peripheral electrodes 36 and the right and left peripheral electrodes 36 are each formed into a trapezoid.

Figure 16:
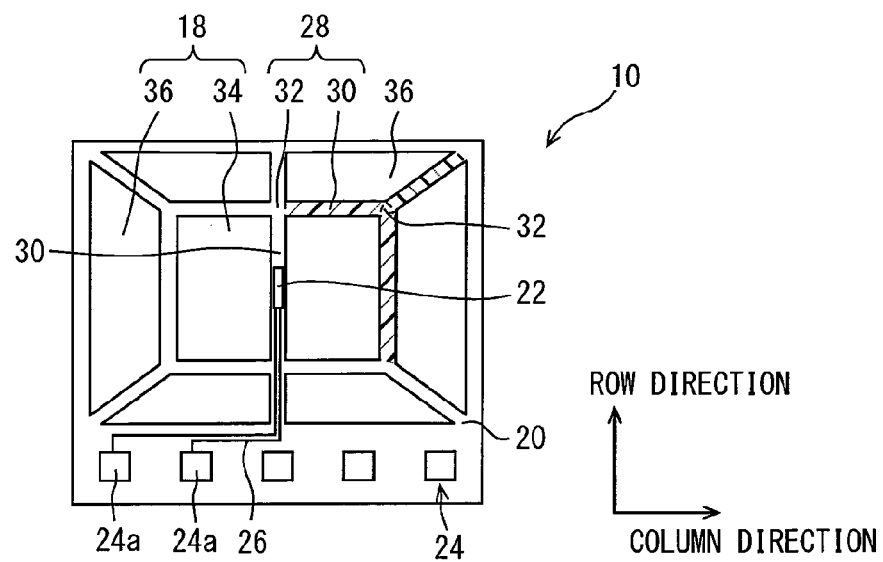
FIG. 16 is a top view illustrating a fourth modification.

In FIG. 16, a Y-shaped intersection portion and the cross intersection portion define the intersection region 32.

The preferred embodiments of the present disclosure have been described above. However, the present disclosure is not limited to the embodiments described above, and various modifications can be implemented without departing from the spirit of the present disclosure.

The arrangement of the temperature sensor 22 is not limited to substantially the center of a region in which the front surface electrode 18 is formed. For example, in FIG. 15, the temperature sensor 22 may be disposed in the opposite region 30 of the respective peripheral electrodes 36.

The element formed on the semiconductor substrate 12 is not limited to the IGBT. Any element can be employed if a temperature of the semiconductor substrate 12 (element) is detected by the temperature sensor 22, and the operation of the temperature sensor 22 is controlled. A power transistor other than the IGBT, for example, a power MOSFET can be employed.

The temperature sensor 22 is not limited to a diode made of polysilicon. For example, a diode formed by introducing impurity into the semiconductor substrate 12 may be used as the temperature sensor 22. In that case, the temperature sensor 22 is formed not on the front surface of the semiconductor substrate 12, but on a surface layer of the front surface of the semiconductor substrate 12.

The division direction of the front surface electrode 18 is not limited to the two directions of the row direction and the column direction. The front surface electrode 18 may be divided into at least two directions different from each other.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

The invention claimed is:

1. A semiconductor device comprising:
   a semiconductor substrate having an element;
   a front surface electrode that is electrically connected to the element and disposed on a front surface of the semiconductor substrate;
   a rear surface electrode that is electrically connected to the element and disposed on a rear surface of the semiconductor substrate opposite to the front surface;
   a protective film that is disposed on the front surface of the semiconductor substrate in a separation region; and
   a temperature sensor that is disposed on a front surface side of the semiconductor substrate, wherein:
   the front surface electrode is divided into a plurality of pieces along at least two directions on the front surface with the protective film in the separation region;
   the separation region includes an opposing region located between opposing sides of divided pieces of the front surface electrode, which are adjacent to each other, and an intersection region, at which the opposing region intersects;
   the temperature sensor is disposed in only the opposing region;
   the at least two directions are a row direction and a column direction orthogonal to each other on the front surface; and
   the front surface electrode is divided into the plurality of pieces along the row direction and the column direction.

2. The semiconductor device according to claim 1, wherein:
   the divided pieces of the front surface electrode are line-symmetric with respect to the row direction, and are line-symmetric with respective to the column direction.

3. The semiconductor device according to claim 2, wherein:
   the temperature sensor is disposed in a center of a region, in which the front surface electrode is arranged.

4. The semiconductor device according to claim 3, wherein:
   the front surface electrode is divided into an odd number of pieces in the column direction, and divided into an even number of pieces in the column direction; and
   the temperature sensor is disposed in the opposing region corresponding to a center piece of the odd number of pieces in the row direction.

5. The semiconductor device according to claim 3, wherein:
   the front surface electrode is divided into an odd number of pieces in the row direction;

only a center row of the odd numbers of pieces is divided into an even number of pieces in the column direction; and remaining rows other than the center row are respectively divided into an odd number of pieces in the column direction.

6. The semiconductor device according to claim 3, wherein:

the front surface electrode is divided into four or more even numbers of pieces in the column direction;

only two center columns are respectively divided into an odd number of pieces in the row direction; and remaining columns other than two center columns are respectively divided into an even number of pieces in the row direction.

7. The semiconductor device according to claim 3, wherein:

the front surface electrode includes two center electrodes adjacent to the opposing region, in which the temperature sensor is disposed, and a plurality of peripheral electrodes arranged to surround the center electrodes.

\* \* \* \* \*

UNITED STATES PATENT AND TRADEMARK OFFICE
CERTIFICATE OF CORRECTION

PATENT NO. : 9,691,713 B2
APPLICATION NO. : 14/888098
DATED : June 27, 2017
INVENTOR(S) : Sugiura et al.

Page 1 of 1

It is certified that error appears in the above-identified patent and that said Letters Patent is hereby corrected as shown below:

On the Title Page

Item (73) Assignees should read: -- DENSO CORPORATION, Kariya-city, Japan and FUJI ELECTRIC CO., LTD., Kawasaki-shi, Japan --

Signed and Sealed this
Fifth Day of September, 2017

Joseph Matal
*Performing the Functions and Duties of the*
*Under Secretary of Commerce for Intellectual Property and*
*Director of the United States Patent and Trademark Office*